US008569871B2

(12) United States Patent
Fujita et al.

(10) Patent No.: US 8,569,871 B2
(45) Date of Patent: Oct. 29, 2013

(54) SEMICONDUCTOR DEVICE HAVING A MOLDED PACKAGE

(75) Inventors: Koichi Fujita, Tokyo (JP); Yoji Maruyama, Hiroshima (JP); Kenji Hino, Hiroshima (JP)

(73) Assignee: Mitsubishi Electric Corporation, Tokyo (JP)

( * ) Notice: Subject to any disclaimer, the term of this patent is extended or adjusted under 35 U.S.C. 154(b) by 1514 days.

(21) Appl. No.: 11/451,372

(22) Filed: Jun. 13, 2006

(65) Prior Publication Data

US 2007/0132110 A1 Jun. 14, 2007

(30) Foreign Application Priority Data

Dec. 12, 2005 (JP) ................................. 2005-357517

(51) Int. Cl.
  *H01L 23/495* (2006.01)
(52) U.S. Cl.
  USPC ............................ 257/676; 257/675; 257/276
(58) Field of Classification Search
  USPC .......... 257/276, 787, 796, 688, 675, 666, 696
  See application file for complete search history.

(56) References Cited

U.S. PATENT DOCUMENTS

| 4,510,554 | A | * | 4/1985 | Irikura | 361/540 |
| 4,974,057 | A | * | 11/1990 | Tazima | 257/693 |
| 5,594,234 | A | | 1/1997 | Carter et al. | |
| 5,631,809 | A | * | 5/1997 | Takagi et al. | 361/820 |
| 6,034,422 | A | * | 3/2000 | Horita et al. | 257/677 |
| 6,198,163 | B1 | * | 3/2001 | Crowley et al. | 257/706 |
| 6,208,023 | B1 | * | 3/2001 | Nakayama et al. | 257/696 |
| 6,211,462 | B1 | * | 4/2001 | Carter et al. | 174/522 |
| 6,242,797 | B1 | * | 6/2001 | Ichikawa et al. | 257/666 |
| 6,246,110 | B1 | * | 6/2001 | Kinsman et al. | 257/672 |
| 6,246,111 | B1 | * | 6/2001 | Huang et al. | 257/675 |
| 6,713,849 | B2 | * | 3/2004 | Hasebe et al. | 257/667 |
| 2002/0041039 | A1 | * | 4/2002 | Bai | 257/790 |
| 2003/0038382 | A1 | * | 2/2003 | Combs | 257/796 |
| 2004/0046240 | A1 | | 3/2004 | Hasebe et al. | |

FOREIGN PATENT DOCUMENTS

| JP | 3-222465 A | 10/1991 |
| JP | 04-174547 | 6/1992 |
| JP | 06-061396 | 3/1994 |
| JP | 8-213536 | 8/1996 |

(Continued)

OTHER PUBLICATIONS

Japanese Patent Office; English language translation of Japanese Office Action (Aug. 30, 2011).
Japanese Patent Office, Office Action (Mar. 13, 2012).

*Primary Examiner* — Allen Parker
(74) *Attorney, Agent, or Firm* — Leydig, Voit & Mayer, Ltd.

(57) ABSTRACT

A semiconductor device having a molded package includes a semiconductor chip, a thick-film lead electrode to which the semiconductor chip is die-bonded, a thin-film lead electrode having a thickness smaller than that of the thick-film lead electrode, a wire which electrically connects the semiconductor chip to the thin-film lead wire, and a molding material in which the semiconductor chip and the wire are encapsulated. A portion of a lower surface of the thick-film lead electrode is exposed at a package lower surface as a heat dissipating electrode. A portion of an upper surface of the thin-film lead electrode is exposed at a package upper surface as an input/output electrode. A portion of an upper surface of the thick-film lead electrode is exposed at the package upper surface as a grounding electrode.

6 Claims, 8 Drawing Sheets

(56) References Cited

FOREIGN PATENT DOCUMENTS

| | | |
|---|---|---|
| JP | 8-330477 A | 12/1996 |
| JP | 10-321768 A | 12/1998 |
| JP | 2001-144229 | 5/2001 |
| JP | 2002-110888 A | 4/2002 |
| JP | 2002-170917 A | 6/2002 |
| WO | WO 02/061835 A1 | 8/2002 |

\* cited by examiner

SEMICONDUCTOR DEVICE HAVING A MOLDED PACKAGE

BACKGROUND OF THE INVENTION

1. Field of the Invention

The present invention relates to a molded package operating at a high frequency or a high output and, more particularly, to a molded package having an improved heat dissipation effect and improved high-frequency characteristics and capable of performing electrical grounding and heat dissipation separately from each other.

2. Background Art

FIG. 12 shows an example of a conventional molded package operating at a high frequency or a high output (see, for example, Japanese Patent Laid-Open No. 8-213536). As illustrated, thin-film lead electrodes 51 are bent downward to form input/output lead electrodes 52. Also, the thin-film lead electrodes 51 are bent upward to form die pad portions 53 to which a semiconductor chip 54 is bonded, for example, by soldering. The semiconductor chip 54 is connected to the input/output lead electrodes 52 through metal wires 56. The semiconductor chip 54 and the metal wires 56 are encapsulated in a molding material 57 such as a plastic. Some of the lead electrodes 51 are exposed on the die pad portion 53 to form a grounding electrode 55. In this way, the ground inductance is reduced and an improved heat dissipation effect is achieved.

FIG. 13 shows another conventional molded package using thin-film lead electrodes 51 like the above-described one. As illustrated, input/output lead electrodes 52 and a grounding electrode 55 are formed so as to contain a plane common with each other.

In these molded packages, however, the lead electrodes usually have a small thickness of about 0.2 mm and a small heat capacity and, therefore, the heat dissipation effect is low and there is a need for a heat sink of a large heat capacity for limiting the increase in temperature of the semiconductor chip. Also, the high-frequency characteristics cannot be improved because the parasitic inductance and parasitic capacitance are increased.

FIG. 14 is a sectional view of an example of a conventional molded package having an improved heat dissipation effect and improved high-frequency characteristics (see, for example, Japanese Patent Laid-Open No. 4-174547). FIG. 15 is a top view of the molded package shown in FIG. 14. As illustrated, a semiconductor chip 54 is die-bonded to a grounding electrode 58 formed of a thick lead electrode and an upper surface of the grounding electrode 58 is exposed from molding material 57 to improve the heat dissipation effect.

FIG. 16 is a sectional view of another molded package having an improved heat dissipation effect and improved high-frequency characteristics (see, for example, Japanese Patent Laid-Open No. 6-61396).

In the conventional molded packages, however, it is difficult to perform electrical grounding and heat dissipation separately from each other.

SUMMARY OF THE INVENTION

In view of the above-described problems, an object of the present invention is to provide a molded package having an improved heat dissipation effect and improved high-frequency characteristics and capable of performing electrical grounding and heat dissipation separately from each other.

According to one aspect of the present invention, a molded package has a semiconductor chip, a thick-film lead electrode to which the semiconductor chip is die-bonded, a thin-film lead electrode having a thickness smaller than that of the thick-film lead electrode, a wire which electrically connects the semiconductor chip and the thin-film lead wire, and a molding material in which the semiconductor chip and the wire are encapsulated. A portion of a lower surface of the thick-film lead electrode is exposed in a package lower surface to be used as a heat dissipating electrode. A portion of an upper surface of the thin-film lead electrode is exposed in a package upper surface to be used as an input/output electrode. A portion of an upper surface of the thick-film lead electrode is exposed in the package upper surface to be used as a grounding electrode. A molded package has a semiconductor chip, a thick-film lead electrode to which the semiconductor chip is die-bonded, a thin-film lead electrode having a thickness smaller than that of the thick-film lead electrode, a wire which electrically connects the semiconductor chip and the thin-film lead wire, and a molding material in which the semiconductor chip and the wire are encapsulated. A portion of a lower surface of the thick-film lead electrode is exposed in a package lower surface to be used as a heat dissipating electrode. A portion of an upper surface of the thin-film lead electrode is exposed in a package upper surface to be used as an input/output electrode. A portion of an upper surface of the thick-film lead electrode is exposed in the package upper surface to be used as a grounding electrode.

According to the present invention, the heat dissipation effect and high-frequency characteristics can be improved and electrical grounding and heat dissipation can be performed separately from each other.

Other and further objects, features and advantages of the invention will appear more fully from the following description.

DETAILED DESCRIPTION OF THE PREFERRED EMBODIMENTS

First Embodiment

Figure 1:
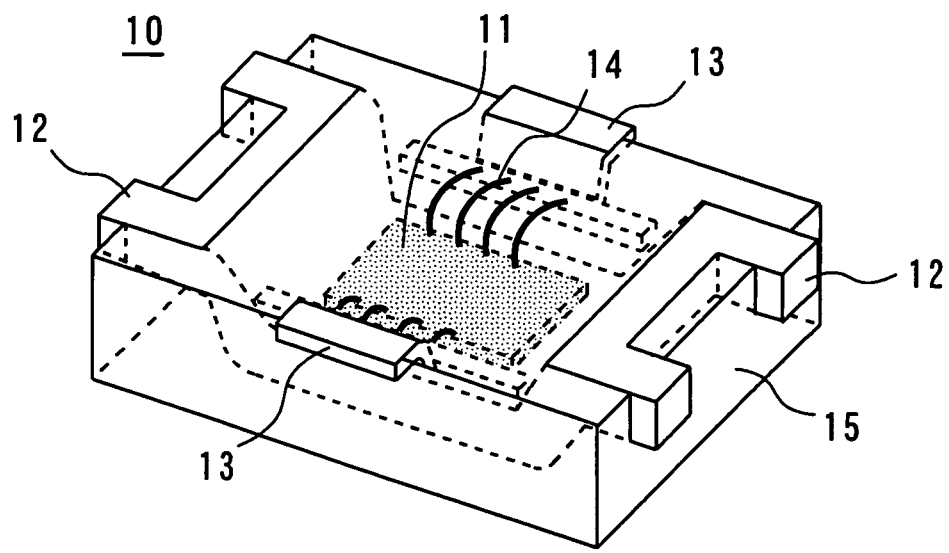
FIG. 1 is a perspective view showing a molded package according to a first embodiment of the present invention.
Figure 2:
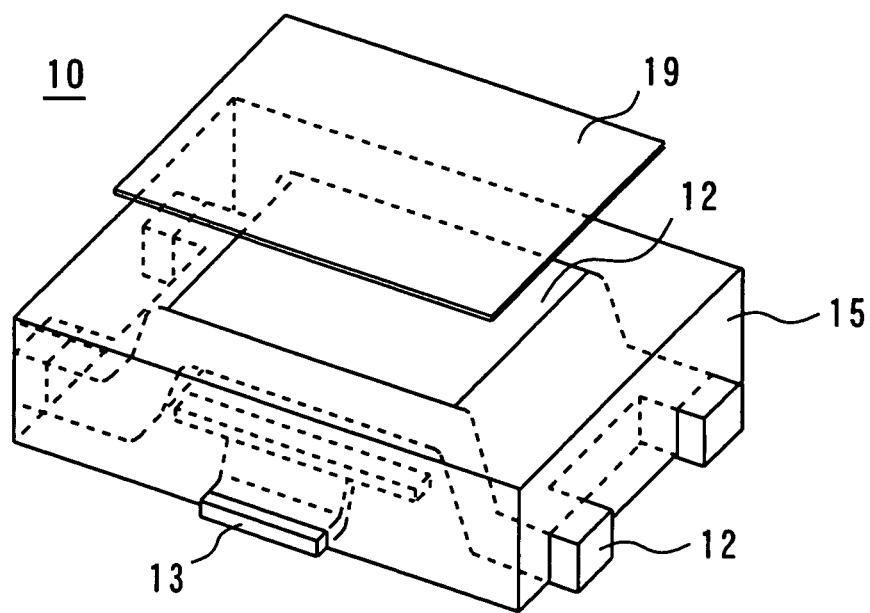
FIG. 2 shows a state in which the molded package shown in FIG. 1 is placed upside down.

FIG. 1 is a perspective view showing a molded package according to a first embodiment of the present invention. FIG. 2 shows a state in which the molded package shown in FIG. 1 is placed upside down. As illustrated, a semiconductor chip 11 is die-bonded, for example, by soldering to a recessed portion of a thick-film lead electrode 12 having a thickness of about 0.4 to 1.0 mm. The recessed portion is formed by bending the thick-film lead electrode 12 on opposite sides of a central portion of the thick-film lead electrode 12. Thin-film lead electrodes 13 having a thickness of about 0.05 to 0.2 mm are bent downward so as to be closer to the semiconductor chip 11 and are electrically connected to the semiconductor chip by metal wires 14. The semiconductor chip 11 and the metal wires 14 are encapsulated in a molding material 15 such as a plastic to form a molded package 10.

Figure 3:
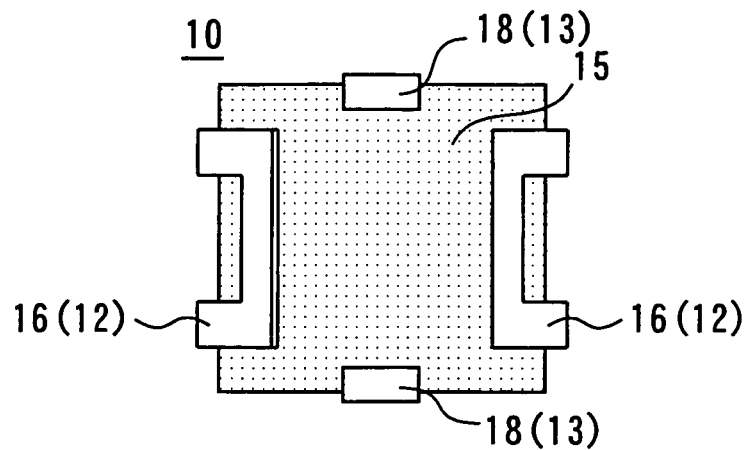
FIG. 3 shows a top view of a molded package according to a first embodiment of the present invention.
Figure 4:
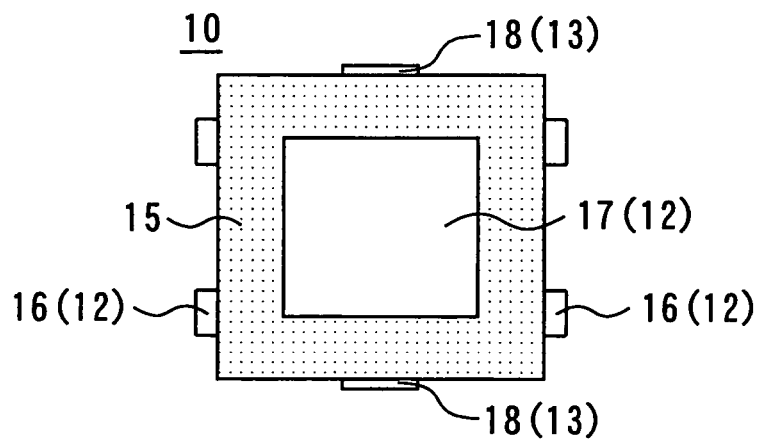
FIG. 4 shows a bottom view of a molded package according to a first embodiment of the present invention.
Figure 5:
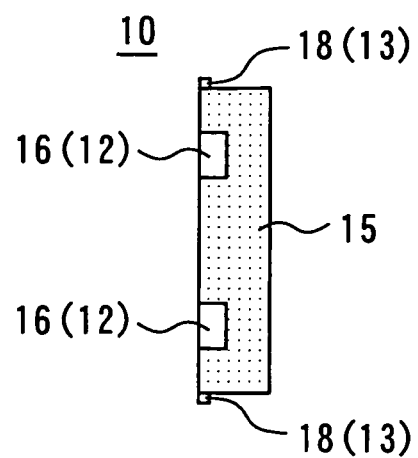
FIG. 5 shows a side view of a molded package according to a first embodiment of the present invention.

FIG. 3 shows a top view of this molded package; FIG. 4 a bottom view; and FIG. 5 a side view. As illustrated, portions of the upper surface of the thick-film lead electrode 12 is exposed in the upper surface of the molded package 10 to be used as a grounding electrode 16, while a portion of the lower surface of the thick-film lead electrode 12 is exposed in the lower surface of the molded package 10 to be used as a heat dissipating electrode 17 for dissipating heat generated in the semiconductor chip 11. Also, portions of the supper surface of the thin-film head electrodes 13 are exposed in the upper surface of the molded package 10 to be used as input/output lead electrodes 18.

This molded package is used in the state shown in FIG. 2. The heat dissipating electrode 17 is not electrically grounded. Only heat dissipation is effected through the heat dissipating electrode 17. Accordingly, a heat dissipating sheet 19 formed of an insulating material is inserted between a heat sink plate (not shown) and the heat dissipating electrode 17.

Figure 6:
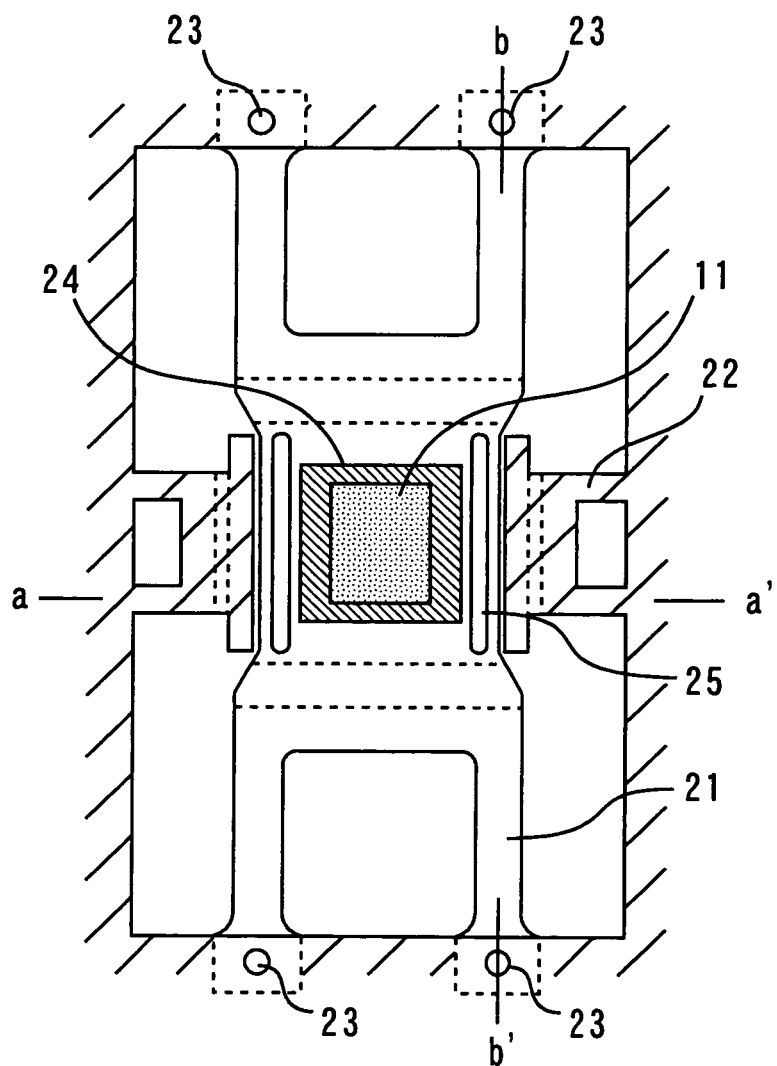
FIG. 6 is a top view of a thick-film lead electrode 21 and thin film lead electrodes 22 in a lead frame state.
Figure 7:
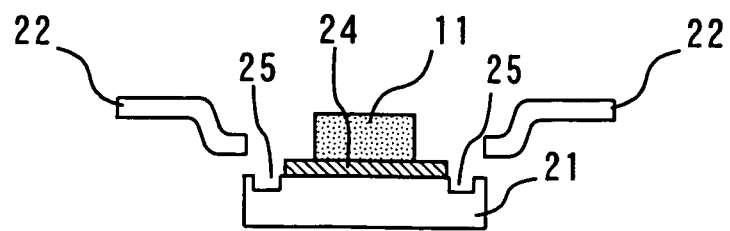
FIG. 7 is a sectional view taken along line a-a' of FIG. 6.
Figure 8:
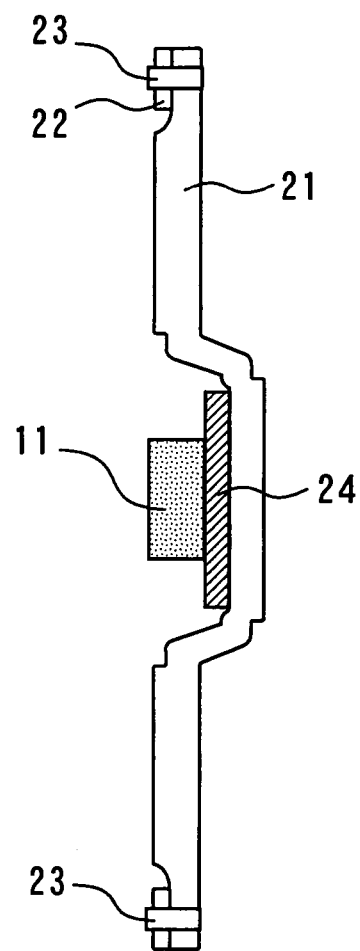
FIG. 8 is a sectional view taken along line b-b' of FIG. 6.

The thick-film lead electrode 12 and the thin-film lead electrodes 12 in a lead frame state will be described. FIG. 6 is a top view of a thick-film lead electrode 21 and thin film lead electrodes 22 in a lead frame state. FIG. 7 is a sectional view taken along line a-a' of FIG. 6. FIG. 8 is a sectional view taken along line b-b' of FIG. 6.

The thick-film lead electrode 21 and thin film lead electrodes 22 in a lead frame state are made by using a copper (Cu)-based material. The two lead frames are connected to each other by crimp portions 23 provided at positions at which the semiconductor chip 11 is not formed. The thick-film lead electrode 21 is bent into a recessed form. The thin film lead electrodes 22 are bent downward so as to optimize the bonding distance to the semiconductor chip 11.

A plating layer 24 is formed by plating, for example, with silver (Ag) on the recessed portion of the thick-film lead electrode 21, i.e., the region where the semiconductor 11 is die-bonded by soldering for example. Thermal stress produced in the semiconductor chip 11 due to heat at the time of die bonding or generation of heat in the semiconductor chip 11 during operation can be reduced by the plating layer 24. In a case where silver(Ag)-based solder for example is used for die bonding, the plating layer 24 is formed of silver (Ag).

Figure 9:
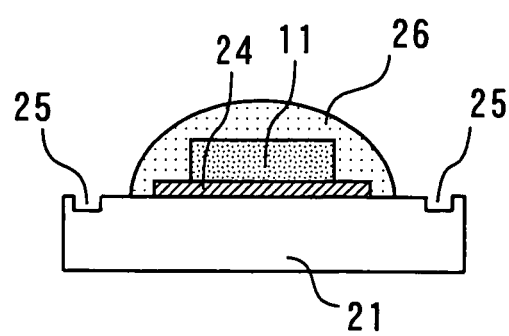
FIG. 9 is a sectional view showing a semiconductor chip whose surface is covered a coating material.

Stopper grooves 25 are provided on the periphery of the semiconductor chip 11 mount portion to prevent a resin-based coating material 26 from flowing to the side surface or lower surface of the thick-film lead electrode 21 when the coating material 26 is applied so as to cover the surface of the semiconductor chip 11 as shown in FIG. 9.

Figure 10:
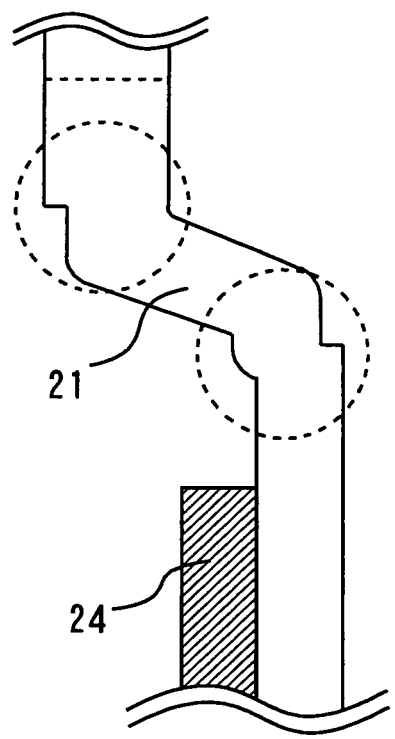
FIG. 10 is an enlarged view of bent portions of the thick-film lead electrode shown in FIG. 8.

FIG. 10 is an enlarged view of bent portions of the thick-film lead electrode shown in FIG. 8. As illustrated, the thick-film lead electrode 21 is bent in a multi-stage bending manner so as to have portions perpendicular to its upper and lower surfaces in the vicinity of the upper and lower surfaces of the package. These portions prevent fixation of unnecessary molding material 15 (burr) on the grounding electrode 16 or heat dissipating electrode 17 formed by the exposed portion of the upper or lower surface of the thick-film lead electrode 21 at the time of encapsulation in molding material 15 performed afterward.

As described above, the grounding electrode 16 is formed by the thick-film lead electrode 12 and the heat dissipating electrode 17 is also formed by the thick-film lead electrode 12 to improve the heat dissipation effect and to thereby prevent any excessive increase in temperature of the semiconductor chip even in a case where the heat capacity of the heat sink plate in contact with the heat dissipating electrode 17 is low or in a case where the closeness of contact between the heat sink plate and the heat dissipating electrode 17 is not sufficiently high.

The ground inductance and ground resistance can be reduced to enable operation at a higher frequency in comparison with the case where the grounding electrode 16 is formed by thin-film lead electrodes 13.

The grounding electrode 16 is formed in the package upper surface, while the heat dissipating electrode 17 is formed in the package lower surface, thereby enabling electrical grounding and heat dissipation to be performed separately from each other.

It is preferred that the grounding electrode 16 exposed in the upper surface of the molded package be generally U-shaped. If the grounding electrode 16 has such a shape, the cut area of the thick-film lead electrode 12 at the time of cutting (tie bar cutting) of the lead frame for the thick-film lead electrode 12 can be reduced and the lead frame can be cut under the same conditions as in the case of cutting of the lead frame for conventional thin-film lead electrodes. Also, because of filling with the molding material at the portion to be cut, the strength against separation between the molding material and the thick-film electrode is increased.

It is preferable to form a copper oxide film by oxidizing the surfaces of the thick-film lead electrode 21 and the thin-film lead electrodes 22$mp$ when a high-temperature treatment for die bonding for example is performed. Copper oxide suitably intimately contacts the molding material and is therefore capable of preventing water from entering through the interface between the lead frame and the molding material and has the effect of improving the moisture resistance of the semiconductor chip.

This embodiment has been described with respect to a case where one input electrode and one output electrode are provided. However, the present invention has the same effects when applied to a package having a multiplicity of electrodes. The semiconductor chip is not limited to a particular kind. The present invention has the same effects when applied to any kind of semiconductor chip having a silicon substrate or a substrate made of a compound such as GaAs or InP.

Second Embodiment

Figure 11:
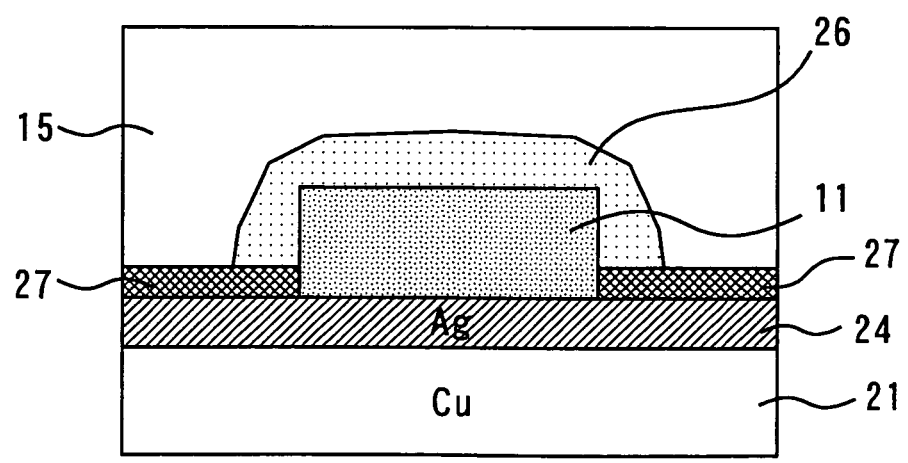
FIG. 11 is a sectional view showing a molded package according to a second embodiment of the present invention.
Figure 12:
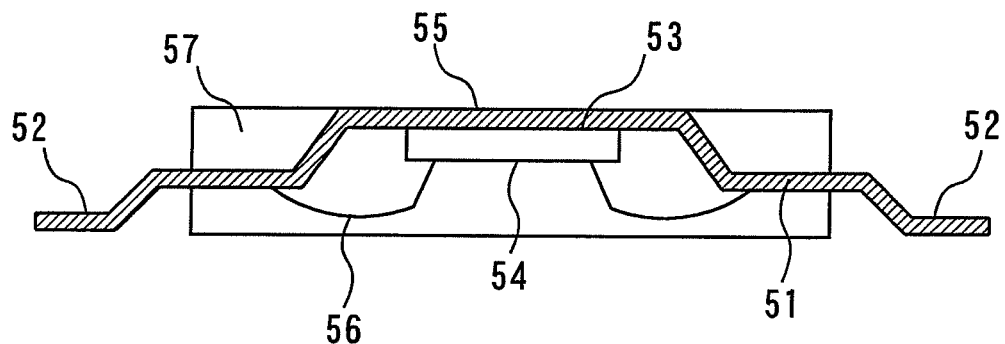
FIG. 12 shows an example of a conventional molded package operating at a high frequency or a high output.
Figure 13:
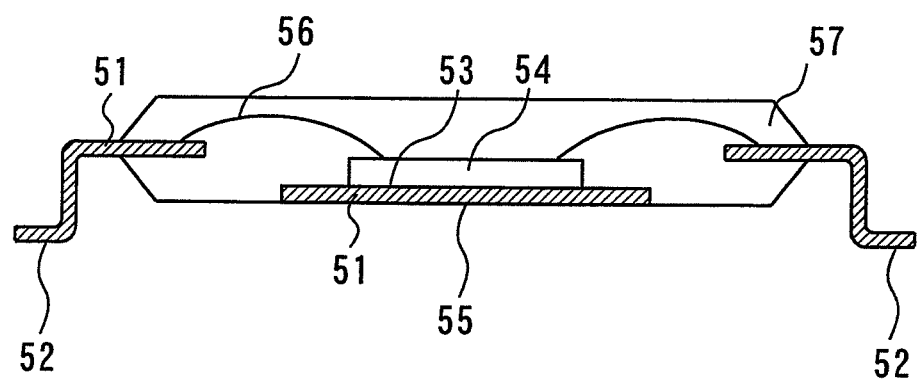
FIG. 13 shows another conventional molded package using thin-film lead electrodes 51 like the above-described one.
Figure 14:
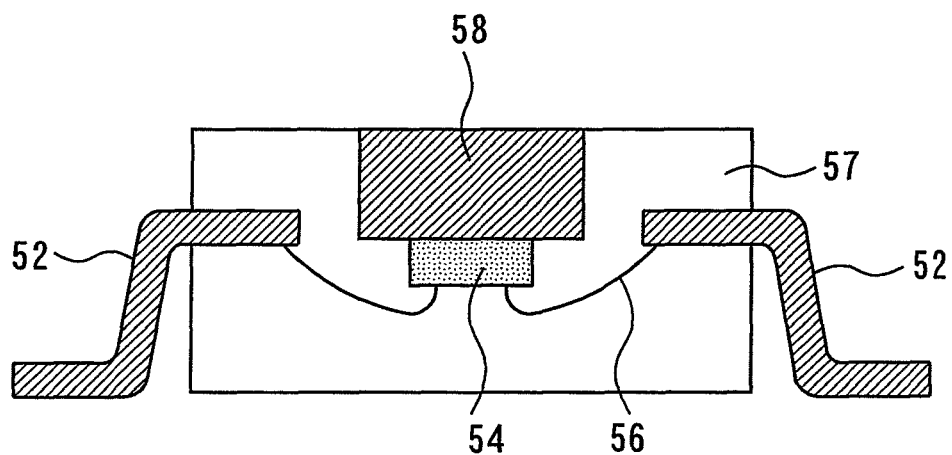
FIG. 14 is a sectional view of an example of a conventional molded package having an improved heat dissipation effect and improved high-frequency characteristics.
Figure 15:
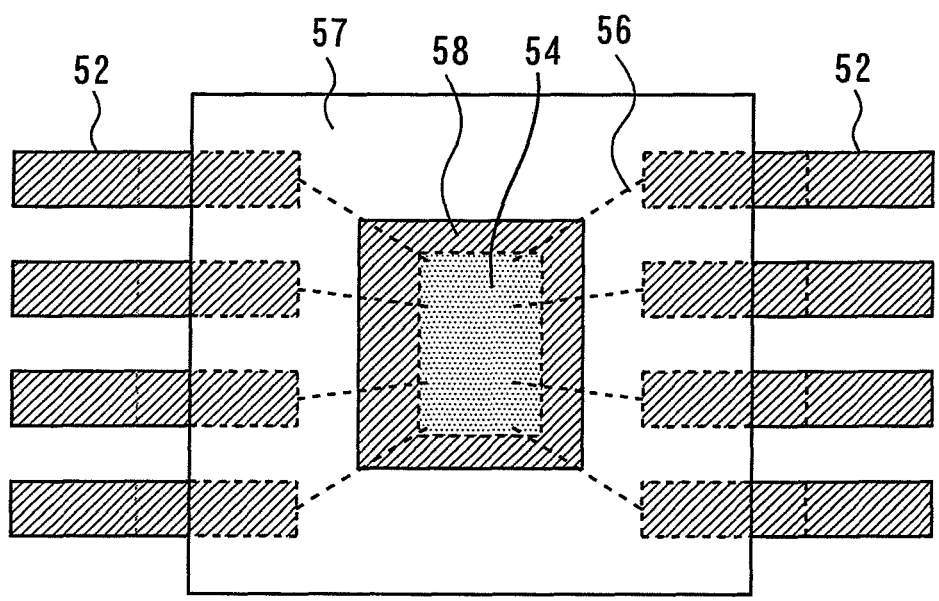
FIG. 15 is a top view of the molded package shown in FIG. 14.
Figure 16:
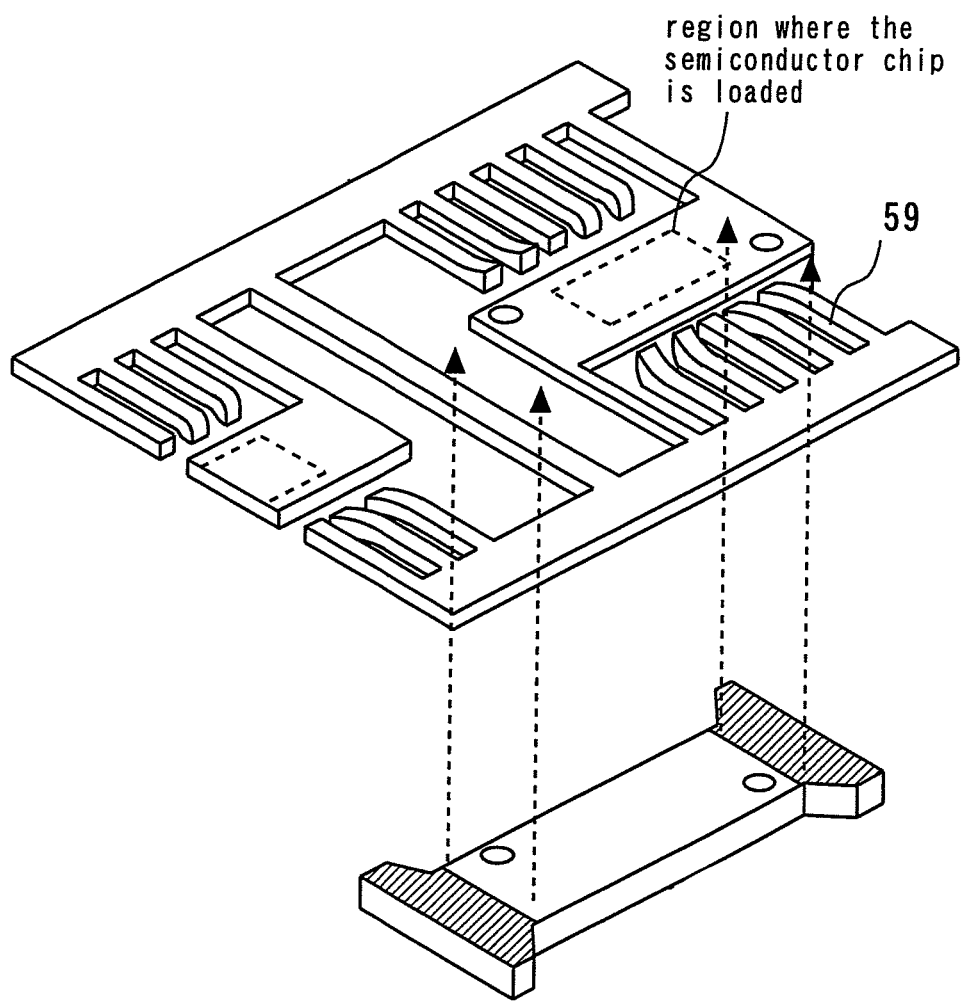
FIG. 16 is a sectional view of another molded package having an improved heat dissipation effect and improved high-frequency characteristics.

FIG. 11 is a sectional view showing a molded package according to a second embodiment of the present invention. Constituents identical or corresponding to those shown in FIGS. 1 through 10 are indicated by the same reference numerals and the description for them will not be made.

In the molded package according to this embodiment, a copper oxide film 27 is precipitated on a plating layer 24 formed by plating with silver (Ag) for example. The closeness of contact between the thick-film lead electrode 21 and the molding material 15 in the vicinity of the semiconductor chip 11 is thereby improved to further improve the reliability of the semiconductor chip 11.

As a method for precipitation of the copper oxide film 27 on the plating layer 24, a method may be used in which the surface of the thick-film lead electrode 21 is oxidized in an atmosphere in which the proportion of an inert gas such as nitrogen ($N_2$) is high to cause copper oxide formed on the surface of the thick-film lead electrode 21 to diffuse over the plating layer 24 and precipitate on the surface of the plating layer 24.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2005-357517, filed on Dec. 12, 2005 including specification, claims, drawings and summary, on which the Convention priority of the present application is based, are incorporated herein by reference in its entirety.

What is claimed is:

1. A semiconductor device having a molded package comprising:
    a semiconductor chip;
    a thick-film lead electrode having
        opposed upper and lower surfaces and
        a thickness between the upper and lower surfaces,
        wherein the thick-film lead electrode is a copper-based material:
    a plated Ag layer on part of the upper surface of the thick-film lead electrode,
    wherein the semiconductor chip is die-bonded to the plated Ag layer at the upper surface of the thick-film lead electrode,
    the semiconductor chip
        covers a first region of the plated Ag layer and
        does not cover a second region of the plated Ag layer, and
    the second region of the plated Ag layer is adjacent to the first region of the plated Ag layer;
    a copper oxide film
        on the upper surface of the thick-film lead electrode that is not covered by the plated Ag layer and
        on the second region of the plated Ag layer
        so that the second region of the plated Ag layer extends between the upper surface of the thick-film lead electrode and at least part of the copper oxide film;
    a thin-film lead electrode having
        opposed upper and lower surfaces and
        a thickness between the upper and lower surfaces,
        the thickness of the thin-film lead electrode being smaller than the thickness of the thick-film lead electrode;
    a wire bonded to the semiconductor chip and to the upper surface of the thin-film lead electrode; and
    a molding material
        encapsulating the semiconductor chip and the wire and
        only partially encapsulating the thick-film and thin-film lead electrodes,
    the molding material having opposed upper and lower surfaces,
    wherein a portion of the lower surface of the thick-film lead electrode is exposed at and on the lower surface of the molding material as a heat dissipating electrode,
    a portion of the upper surface of the thin-film lead electrode is exposed at and on the upper surface of the molding material as an input/output electrode, and
    a portion of the upper surface of the thick-film lead electrode is exposed at and on the package upper surface of the molding material as a grounding electrode.

2. The semiconductor device having a molded package according to claim 1, wherein the semiconductor chip is die-bonded to the plated Ag layer on the thick-film lead electrode at a central portion of the thick-film lead electrode that is within the molding material and that is spaced from the upper surface of the molding material.

3. The semiconductor device having a molded package according to claim 1, further comprising:
    a coating material covering the semiconductor chip, and
    a stopper groove in the upper surface of the thick-film lead electrode at a periphery of a region where the semiconductor chip is die-bonded to the plated Ag layer on the upper surface of the thick-film lead electrode.

4. The semiconductor device having a molded package according to claim 1, wherein the thick-film lead electrode includes two bends so that a part of the thick-film electrode is generally perpendicular to the upper and lower surfaces of the molding material.

5. The semiconductor device having a molded package according to claim 1, wherein the grounding electrode that is exposed at and on the upper surface of the molding has, generally, a U-shape on the upper surface of the molding material.

6. The semiconductor device having a molded package according to claim 1, wherein the copper oxide film is formed on the second region of the plated Ag layer by precipitation while the copper oxide film is being formed on the upper surface of the thick-film lead electrode that is not covered by the plated Ag layer.

* * * * *